(12) United States Patent
Snook et al.

(10) Patent No.: US 9,787,299 B2
(45) Date of Patent: Oct. 10, 2017

(54) SWITCHING CONTROL SYSTEMS

(71) Applicant: Amantys Ltd, Cambridge, Cambridgeshire (GB)

(72) Inventors: Mark Snook, Cambridge (GB); Edward Shelton, Cambridge (GB); Stephen Parker, Cambridge (GB); Matteo Vit, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 603 days.

(21) Appl. No.: 14/367,270

(22) PCT Filed: Dec. 6, 2012

(86) PCT No.: PCT/GB2012/053023
§ 371 (c)(1),
(2) Date: Jun. 20, 2014

(87) PCT Pub. No.: WO2013/093418
PCT Pub. Date: Jun. 27, 2013

(65) Prior Publication Data
US 2014/0346893 A1    Nov. 27, 2014

(30) Foreign Application Priority Data
Dec. 23, 2011 (GB) .................... 1122285.8

(51) Int. Cl.
*H01H 31/10* (2006.01)
*H03K 17/16* (2006.01)
(Continued)

(52) U.S. Cl.
CPC ............ *H03K 17/16* (2013.01); *H02M 1/088* (2013.01); *H03K 17/10* (2013.01); *H03K 17/107* (2013.01);
(Continued)

(58) Field of Classification Search
CPC ...... H03K 17/16; H03K 17/10; H03K 17/107; H03K 17/12; H03K 17/127; H03K 17/163; H02M 1/088; Y10T 307/76
See application file for complete search history.

(56) References Cited

U.S. PATENT DOCUMENTS

| 4,337,494 A | 6/1982 | Huykman |
| 4,746,813 A | 5/1988 | Disser |
| 2010/0148847 A1 | 6/2010 | Schurack et al. |

FOREIGN PATENT DOCUMENTS

| JP | 2007037255 A | 2/2007 |
| JP | 2009050118 A | 3/2009 |

OTHER PUBLICATIONS

International Search Report and Written Opinion from corresponding International Application No. PCT/GB2012/053023, dated Feb. 19, 2013.
(Continued)

*Primary Examiner* — Daniel Cavallari
(74) *Attorney, Agent, or Firm* — Andrew Wilford

(57) ABSTRACT

We describe a system for controlling very large numbers of power semiconductor switching devices (132) to switch in synchronization. The devices are high power devices, for example carrying hundreds of amps and/or voltages of the order of kilovolts. In outline the system comprises a coordinating control system (110, 120), which communicates with a plurality of switching device controllers (130) to control the devices into a plurality of states including a fully-off state, a saturated-on state, and at least one intermediate state between the fully-off and saturated-on states, synchronizing the devices in the at least one intermediate state during switching.

10 Claims, 11 Drawing Sheets

(51) Int. Cl.
*H02M 1/088* (2006.01)
*H03K 17/10* (2006.01)
*H03K 17/12* (2006.01)

(52) U.S. Cl.
CPC ........... *H03K 17/12* (2013.01); *H03K 17/127* (2013.01); *H03K 17/163* (2013.01); *Y10T 307/76* (2015.04)

(56) References Cited

OTHER PUBLICATIONS

Search Report from corresponding UK Application No. GB1122285.8, dated Mar. 26, 2013.

SWITCHING CONTROL SYSTEMS

FIELD OF THE INVENTION

This invention relates to systems and methods for controlling power semiconductor switching devices.

BACKGROUND TO THE INVENTION

The power semiconductor switching devices with which we are concerned typically have a current carrying capability of greater than 1 amp and are operable with a voltage of greater than 100 volts. Embodiments of the devices with which we are concerned are able to carry currents of greater than 10 amps, 50 amps or 100 amps and/or are able to sustain a voltage difference across the device of greater than 500 volts or 1 KV.

Examples of such devices include insulated gate bipolar transistors (IGBTs), as well as FETs such as MOSFETS (vertical or lateral) and JFETs, and potentially devices such as LILETs (lateral inversion layer emitter transistors), SCRs and the like. The techniques we will describe are not limited to any particular type of device architecture and thus the power switching devices may be, for example, either vertical or lateral devices; they may be fabricated in a range of technologies including, but not limited to, silicon, and silicon carbide.

Switching devices of this type have applications which include switching in high voltage transmission lines, in particular dc transmission lines of the type which may, for example, carry power from an offshore wind installation, and medium voltage (for example greater than 1 KV) switching for motors and the like, for example locomotive motors.

In applications of this type typically tens or hundreds of devices may be connected in series and/or parallel to operate at the desired voltages/currents. Controlling the switching of such devices presents particular problems, because the electrical environment is relatively noisy and because the voltages/currents being switched are large, leading to a significant risk of device failure. Moreover when one device in such a system fails, other switching devices in the system can easily fail as a consequence.

We will describe techniques which address these and other problems.

SUMMARY OF THE INVENTION

According to the present invention there is therefore provided a power semiconductor switching device control system for controlling a plurality of power semiconductor switching devices to switch in synchronisation, the system comprising: a coordinating control system; and a plurality of switching device controllers each coupled to said coordinating control system; wherein each said switching device controller is configured to control one or more respective said power semiconductor switching devices into a plurality of states including a fully-off-state, a saturated-on-state, and at least one intermediate state between said fully-off state and said saturated-on state; wherein said coordinating control system is configured to control said switching devices to switch in synchronism by controlling said switching device controllers; and wherein said coordinating control system is further configured to: control said switching device controllers to control said power semiconductor switching devices from an initial state comprising one of said fully-off state and said saturated-on state into said intermediate state; maintain said power semiconductor switching devices in said intermediate state to synchronise switching of said devices; and then control said switching device controllers to control said power semiconductor switching devices from said intermediate state into a final state comprising the other of said fully-off state and said saturated-on state.

An embodiment of such a control system enables the switching of more than 10, 100 or 1000 power semiconductor switching devices to be performed quickly, but also in a controlled, synchronised manner. Thus, broadly speaking, in embodiments of the control system the conduction state of each device is controlled in discrete steps so that the conduction states of the devices change in lockstep. As well as synchronising the switching, this also helps to ensure that the current/voltage load is shared between the devices rather than, for example, one of the devices in a series string bearing the entire voltage across a string. Such a technique may be employed with any semiconductor switching device but is particularly advantageous when the power semiconductor switching devices comprise IGBTs (insulated gate bipolar transistors).

In preferred embodiments of the system the devices are controlled between a plurality of intermediate states these may include, in particular, a state in which a device is maintained at a low-current plateau. Such a low-current plateau may comprise, for example, a current of order 0.1-1 Amp, intermediate between the approximately zero (leakage) off-current and an on-current which may be of order 100 Amps. A second intermediate state which may additionally or alternatively be employed is an active low-voltage plateau state in which the voltage across a device is maintained at an intermediate value between a fully-off voltage and a saturated-on voltage of the device, for example of order 10-100V where the saturated-on voltage may be less than 3 volts and the off-voltage of order 1 KV. The low-current plateau is employed to ensure that parallel connected devices are all active, and the low-voltage plateau is employed to ensure that series connected devices are all active. When devices are active they can respond rapidly to changes in gate charge and this is necessary for synchronised switching. In embodiments described later there may be up to six different states for the devices.

In preferred embodiments the coordinating control system transmits a control signal to the switching device controllers of at least the power semiconductor switching devices to be switched, and then waits until an acknowledgement signal has been received confirming that each device is in the requested state, before sending a further control signal to progress the relevant devices to the next (intermediate or final) state. This form of active control of the switching devices is particularly robust. In embodiments the control and/or acknowledgement/confirmation signals may comprise data packets sent over a packet data communications network. In this case a control signal may comprise a broadcast packet including a group address field for selecting a set of the switching devices for control together with a switch state field defining the next target state. In embodiments of the system these data packets comprise real time data packets; that is they are labelled to be treated as 'real time' and given priority over other data packets which may be sent over the network.

In a preferred system architecture the coordinating control system comprises a central controller coupled to one or more sub-controllers, and each such sub-controller is coupled to a set of device controllers, for example 10 or more device controllers. In this architecture the central controller may be coupled to the sub-controllers via one or more shared buses, but preferably each sub-controller has a separate bus connection to each of the switching device controllers it controls. In embodiments each switching device controller controls one or more power semiconductor switching devices. An architecture of this general type facilitates rapid broadcasting of switch control information, but also facilitates rapid handling of messages between a sub-controller and the switching device controllers to which it is coupled. In particular the dedicated buses for the switching device controllers facilitate combining acknowledgement/confirmation signals from the switching device controllers so that it can easily be determined when all reach the next target state and/or whether any faults are flagged.

The invention also provides, separately, a switching device controller, and a coordinating control system according to aspects/embodiments of the invention.

Thus in a related aspect the invention provides a coordinating control system for controlling a plurality of switching device controllers each coupled to the coordinating control system for switching a plurality of power semiconductor switching devices in synchronism, wherein each said switching device controller is configured to control one or more respective said power semiconductor switching devices into a plurality of states including a fully-off state, a saturated-on state, and at least one intermediate state between said fully-off state and said saturated-on state, the coordinating control system comprising: a system to control said power semiconductor switching devices to switch in synchronism by controlling said switching device controllers; wherein said system to control said power semiconductor switching devices is configured to: control said switching device controllers to control said power semiconductor switching devices from an initial state comprising one of said fully-off state and said saturated-on state into said intermediate state; maintain said power semiconductor switching devices in said intermediate state to synchronise switching of said devices; and then control said switching device controllers to control said power semiconductor switching devices from said intermediate state into a final state comprising the other of said fully-off state and said saturated-on state.

The skilled person will appreciate that a coordinating control system of this type may be implemented in hardware or in software (provided on a physical carrier such as a disk), for example running on a digital signal or other processor, or on a combination of the two. Further, code for implementing aspects/embodiments of the invention may comprise code for a hardware description language. The skilled person will also appreciate that, in embodiments, the coordinating control system may be distributed over a plurality of coupled components in communication with one another.

The invention further provides a method of controlling switching of a plurality of power semiconductor switching devices, starting with each device in an initial state comprising one of a saturated-on and a fully-off state, the method comprising: controlling said power semiconductor switching devices to transition from said initial state to one or more intermediate states between said saturated-on state and said fully-off state; holding said power semiconductor devices in said one or more intermediate states to align said devices in said one or more intermediate states; and then controlling said power semiconductor switching devices to transition from said aligned state to a final state comprising one of said saturated-on and said fully-off state.

The invention still further provides a power semiconductor switching device control system for controlling a plurality of power semiconductor switching devices to switch in synchronisation, starting with each device in an initial state comprising one of a saturated-on and a fully-off state, the system comprising: means for controlling said power semiconductor switching devices to transition from said initial state to one or more intermediate states one or more intermediate states between said saturated-on state and said fully-off state; means for holding said power semiconductor devices in said one or more intermediate states to align said devices in said one or more intermediate states; and means for controlling said power semiconductor switching devices to transition from said aligned state to a final state comprising one of said saturated-on and said fully-off state.

BRIEF DESCRIPTION OF THE DRAWINGS

FIGS. 2a and 2b show, respectively, a power semiconductor switching device control system according to an embodiment of the invention in an example for bridge application, and details of the arrangement of FIG. 2a;

DETAILED DESCRIPTION OF PREFERRED EMBODIMENTS

Figure 1:
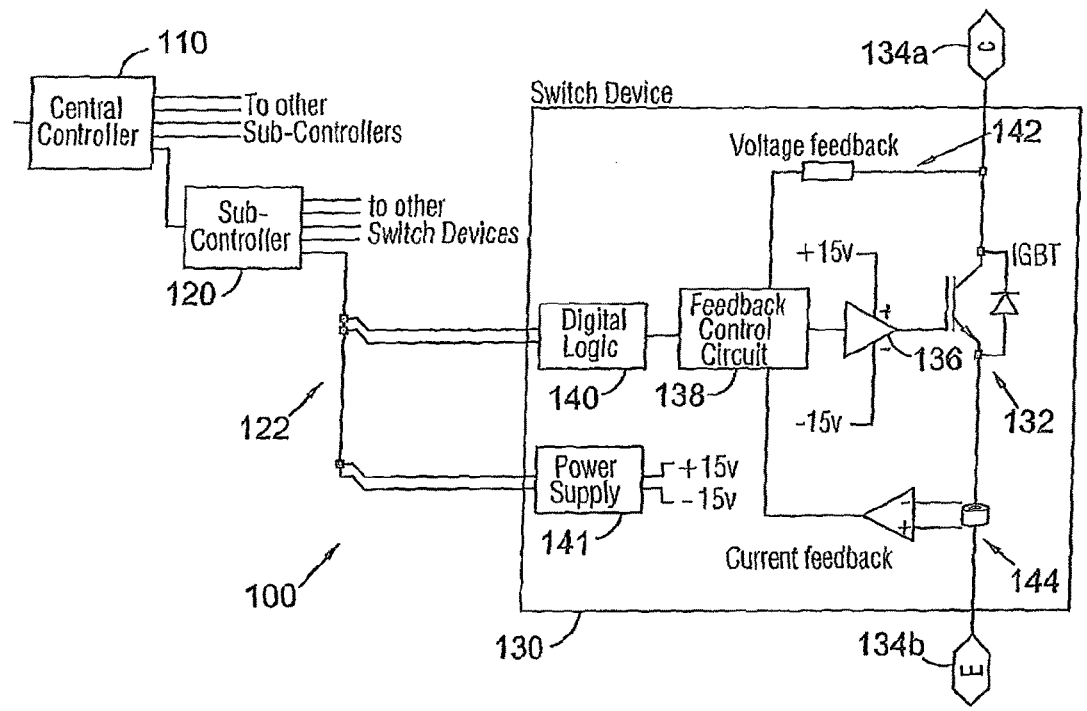
FIG. 1 shows an example of a switching device controller (SD) in combination with a coordinating control system comprising a central controller coupled to a sub-controller according to an embodiment of the invention.

Referring to FIG. 1a, an embodiment of a power semiconductor switching device control system 100 comprises a central controller 110 coupled to a plurality of sub-controllers 120 of which one is illustrated, in turn coupled to a plurality of switching device controllers 130 (again just one is illustrated). In the following description the switching device controller 130 is sometimes referred to as a switch device (SD); and the central controller and sub-controller are sometimes abbreviated to CC and SC respectively. Although in the example of FIG. 1a a sub-controller is provided, this is not essential and embodiments of the control system may employ just a central controller. Other embodiments of the control system may employ multiple levels of (nested) sub-controllers.

A power electronics system or circuit generally comprises a plurality of switches each of which may comprise one, or typically multiple switching devices.

In the example of FIG. 1a the power semiconductor switching device is an IGBT 132, although other devices such as MOSFETs, JFETs and the like may also be employed.

As illustrated, the switching device controller (switch device) 130 comprises digital logic to interface with a bus 122 connecting the device controller 130 to the sub-controller 120. In preferred embodiments the device controller 130 also receives power over this bus and the digital logic 140 includes a circuit to derive power from the bus for powering the low voltage portions of the device controller/switch device 130. In operation the digital logic 140 receives commands and configuration information over bus 122 and replies with acknowledgement and other data as described in more detail later.

The digital logic 140 interfaces with analogue control circuitry 138 coupled, in the illustrated example, to a gate driver 136, driving IGBT 132. We have previously described, in our UK patent application GB1103806.4 filed on 7 Mar. 2011 (hereby incorporated by reference) some example IGBT driving circuits. A particularly preferred circuit is described in our co-pending UK patent application, filed on the same day as this application, and entitled "Power Semiconductor Device Controllers" (hereby incorporated by reference). This employs combined current and voltage feedback as illustrated in FIG. 1, together with an active control system such that the switching device (IGBT) effectively looks like a passive resistor. Thus two active intermediate states are defined by a target resistance value, a high resistance value for an active low current state, and a low resistance value for an active low voltage state (states 3 and 4 described later). Preferably a second control loop is also provided in the controller to servo the gate voltage to threshold values, one just below that at which the device starts to switch on, a second just above that at which the device starts to come out of saturation (states 2 and 5 described later).

More generally, preferred embodiments of the switching device controller 130 of FIG. 1a include a voltage sensing circuit 142 to sense a voltage on the semiconductor switching device and a current sensing circuit 144, to sense a current passing though the device. In some preferred embodiments data from either or both of these sensing circuits is fed back, optionally on request, to one or both of the sub-controller 120 and central controller 110.

Figure 2A:
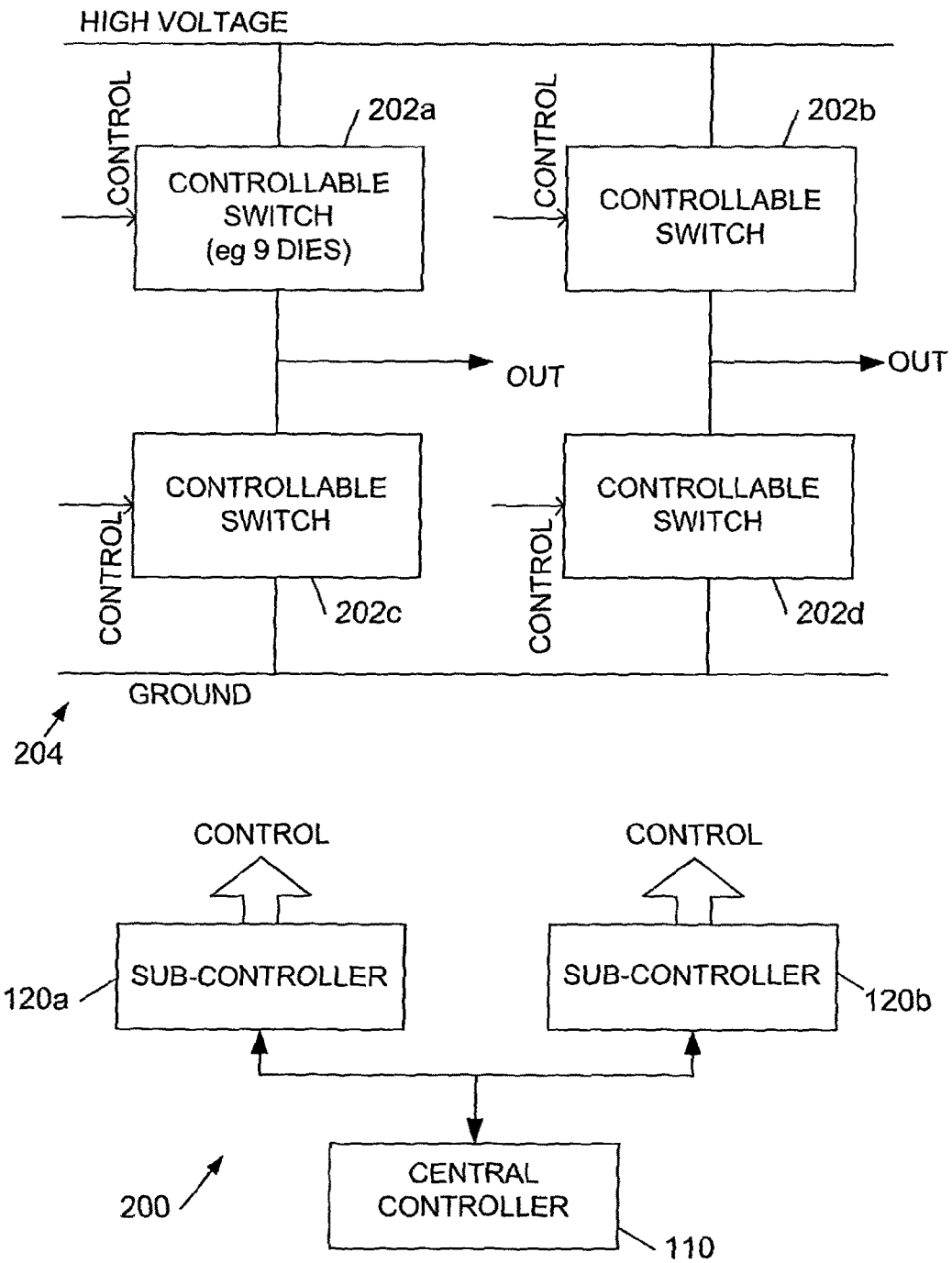
Figure 2B:
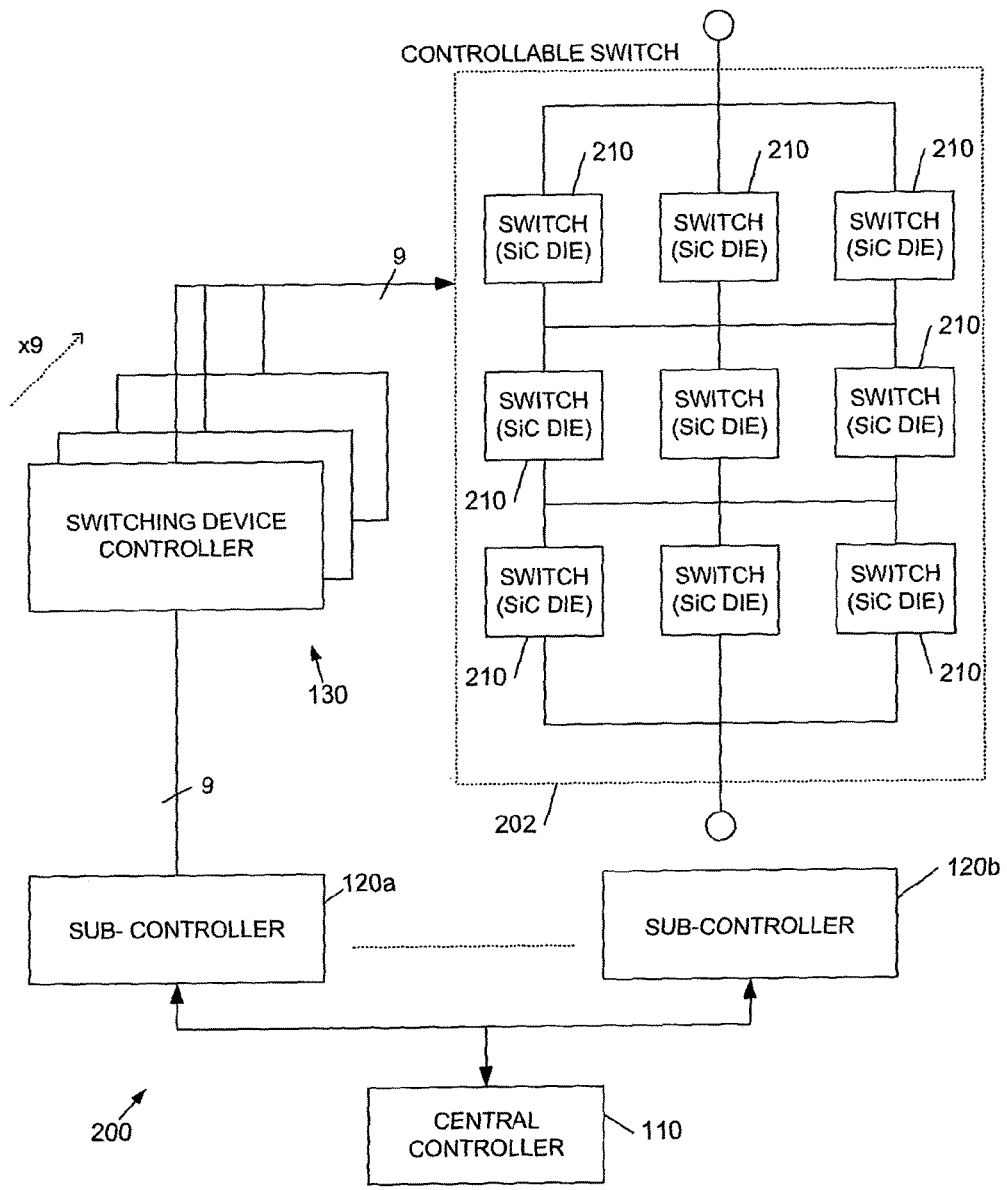

In an electrical power converter such as a full (H-) bridge, half bridge or 3-phase inverter, each switch position may comprise one or more semiconductor switching devices. In high voltage and/or high current applications of the type described in the introduction many semiconductor switching devices may be connected in series and/or parallel, each with a respective switching device controller. FIG. 2a shows an example of an H-bridge electrical power converter 200 which may be employed, for example, for converting DC to AC or vice versa. In this example each switch 202a-d of the H-bridge 204 comprises a set of semiconductor switching device dies, as shown in more detail in FIG. 2b. In the expanded diagram of FIG. 2b a single controllable switch 202 comprises 9 power semiconductor switching devices 210, for example each comprising a silicon carbide die, multiple devices being connected in parallel to create a voltage level, sets of multiple devices then being connected in series to series-connect the voltage levels. In other embodiments a single switching device controller may control two or more switches or device dies). Each switch 210 has a respective switching device controller 130 which, in turn, is coupled to one of the sub-controllers 120a, b.

As illustrated a separate bus runs between a sub-controller and a switching device controller so that there is one such bus for each switching device controller. In one exemplary embodiment a sub-controller provides 30 separate bus connections to respective switching device controllers and thus for the example H-bridge of FIG. 2a, which employs 36 semiconductor switches, two sub-controllers are employed. The skilled person will recognise that in a high-voltage and/or current power electrical circuit with multiple switches hundreds or potentially thousands of semiconductor switching devices may be employed. In such an arrangement the power semiconductor switching devices should be connectable in series and in parallel and the switching device controllers system should be able to control the switching of these devices so that they switch in synchronism, in effect substantially simultaneously.

To facilitate simultaneous control a number of switch states are defined. In one example embodiment these are as follows, (although more or fewer states may be employed in ultimate implementations);

State 1: FULLY OFF—the switch is turned off, only leakage current flows

State 2: OFF WITH LOW GATE VOLTAGE—the switch is turned off but close to the gate threshold voltage State 3: ACTIVE LOW CURRENT—the switch is active but in a state where there is a defined low current flowing through the device.

State 4: ACTIVE LOW VOLTAGE—the switch is active but in a state where there is a defined low voltage (above the saturation voltage) across the device State 5: ON WITH HIGH GATE VOLTAGE—the switch is turned on and in saturation but may not be fully saturated State 6: SATURATED ON—the switch is in a saturated on condition In the active low current state there may be a high voltage across the device but potentially there may be any voltage across the device (this may even be negative if a reverse parallel diode is conducting because current is reversed through switch, as can occur when driving inductive loads). In the active low voltage state there may be near to full current going through the device, but again in principle there may be any current flowing through the device in this state.

Communication of the required switch state is by real-time messages from the central controller to the switching devices. In addition configuration and monitoring data can be exchanged by non-real-time messages.

In broad terms when the device is off there will be a high voltage across the device, for example 1 KV, and substantially zero current (just the leakage current) and, for example, substantially zero gate voltage. Injecting current into the gate increases the gate voltage a little so that it begins to pass a small current, for example of order 0.1-1 amp; this effectively makes series-coupled devices simultaneously active. To achieve this state may take, for example, of order 50 ns-1 µs, taking into account the time to charge the gate, and propagation delays. From this state, further injection of current into the gate further increases the gate voltage to reach a state where the device is passing substantially more current, for example of order 100 amps, and there is still a residual or 'active' low voltage across the device, for example of order 10 volts. Eventually the gate voltage is driven to its full voltage which may be, for example, of order 15 volts for a silicon device or 20 volts for a silicon carbide device, at which point the device is saturated, passing its full current and has a minimal, saturated-on voltage across the device, for example of order 2 volts.

Figure 3A:
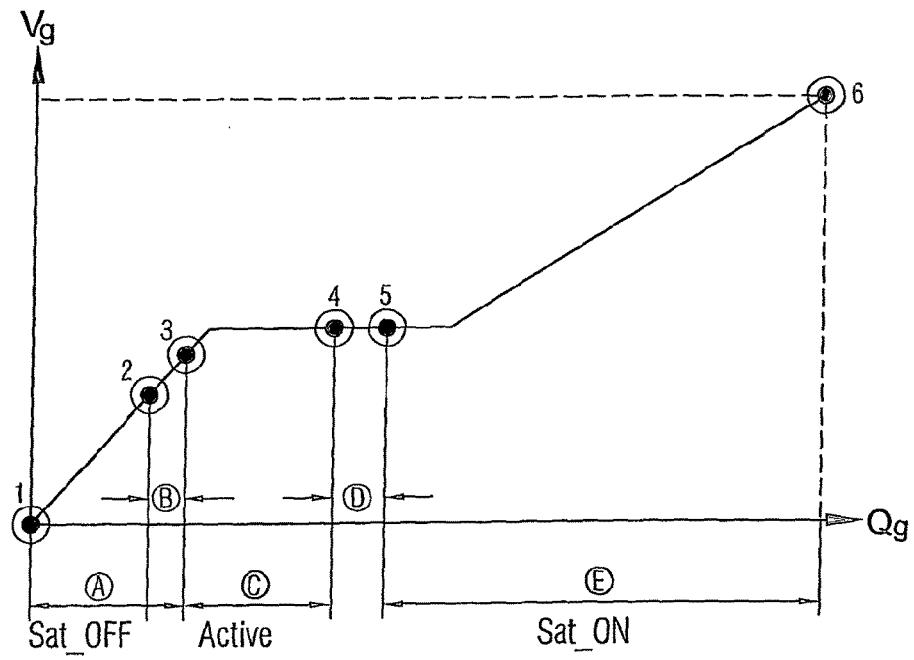
FIGS. 3a to 3c show, respectively, an example of a gate voltage against gate charge curve for a power semiconductor switching device illustrating six defined states and five transitions of the device, and a corresponding table of the states and transitions, and graphs of collector current and collector-emitter voltage against time for switch-on of an IGBT (insulated gate bipolar transistor) power semiconductor switching device.

The above outline description is, in embodiments, a simplification of the various hold states and transitions that are employed, in particular with an IGBT power semiconductor switching device. Thus referring to FIGS. 3a and 3b, six states labelled 1-6 may be employed with 5 transition regions, labelled A-E in between. The table in FIG. 3d describes these states and transitions: in states 1 and 2 the device is OFF; in states 3 and 4 the device is in an intermediate, 'active' state, and in states 5 and 6 the device is ON.

More particularly in state 1 the gate-voltage $V_g=0$ or negative, depending on whether the device is switched off with a zero or negative gate voltage. In state 2 the gate voltage is equal to a first (low) threshold voltage: $V_g=V_{th}$ (low), with the gate voltage rising during transition A. In state 3 the collector current of the IGBT is a defined minimum value $I_{min}$ that is $I_C=I_{min}$. In state 4 the collector-emitter voltage is a defined, minimum voltage value $V_{min}$, that is $V_{ce}=V_{min}$. Transition B moves from state 2 to state 3 and transition C from state 3 to state 4. In state 5 the gate voltage is equal to a second (high) threshold voltage, that is $V_g=V_{th}$ (high), and in state 6 the gate voltage is a maximum, saturated voltage $V_s$, that is $V_g=V_s$, with transition E between states 5 and 6. In moving between states 1 and 6 the device switches from fully OFF to saturated ON (and vice versa). At each state a switching device controller receives a state change command from a central or sub-controller to transition to an adjacent state and then sends an acknowledgement when the transition is complete. The central or sub-controller awaits the acknowledgement from all nodes before proceeding to send out the command for the next state change. Because movement between the states is reversible, a device or group of devices can be moved back from a purported state to an earlier state, for example to return (or alternatively move forward) a set of switching devices to a known good state should a fault be indicated or detected.

Thus in embodiments a central or sub-controller may send a RT packet to a switching device controller (also described later as a 'node') requesting a state change to one of six states. A node sends back an acknowledgement when it has completed a state transition and this information tells the controller when all the connected nodes have achieved the desired state.

Figure 3B:
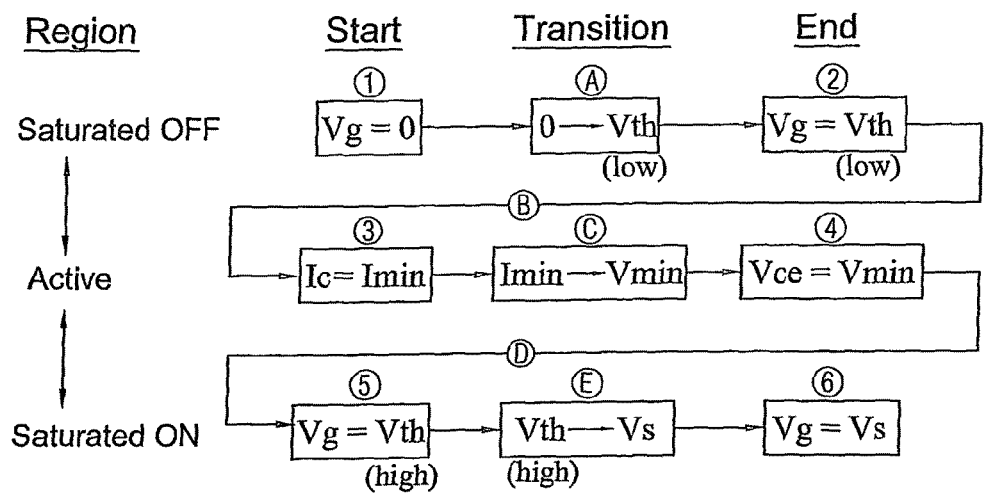

As illustrated in FIG. 3b the 6 states can be broken down into 3 regions each of 2 states, OFF, active and ON, with transitions between the states.

In embodiments this information is encoded by 4 data bits, for example, 4 successive data bits within a real-time packet. The return packet has one flag to indicate that a transition between two states is in progress. A controller can then 'OR' together or bit-by-bit, the packets as they arrive from each node to create a composite packet. In this way, it any one node is still in transition, the combined effect is that the state of the whole block is still in transition, until the very last node has completed its transition to the next state.

As described further later, as well as this four bit payload, a data packet may also include additional payload data bits and preferably at least one packet type (T) bit to define at least two different types of packet, a real-time packet and a non-real-time packet. In preferred embodiments a packet also includes at least one receive error flag and/or at least one flag indicating that the packet is valid. Preferably a packet further includes one or more bits in addition to the previously described data bits for an error detecting (and possibly correcting) code.

Figure 3C:
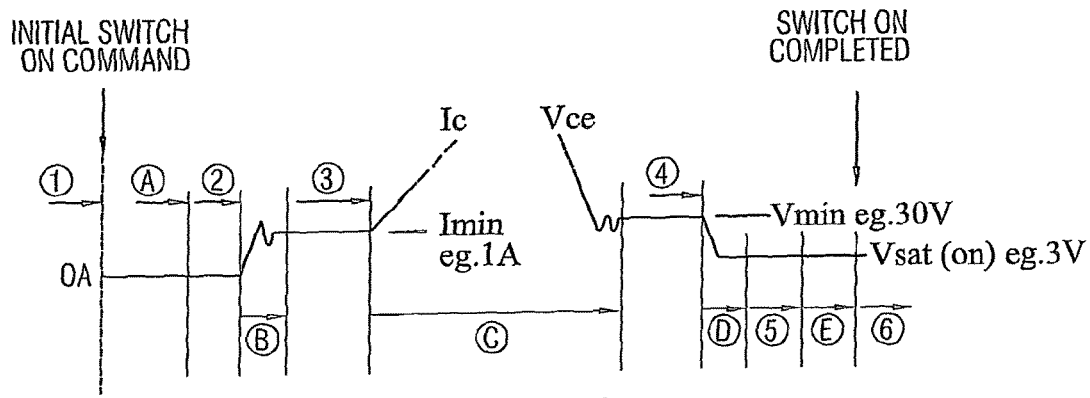

As well as real-time switch control data, data sent from a controller to a node may also comprise non-real-time configuration data and optionally other data such as status change data defining a global system status such as a command to enter a sleep mode, shutdown mode and the like. This status change data (called action command) is preferably sent as real-time data. Data returned from a node to a controller may comprise real-time switch acknowledgement data as previously described, non-real-time monitoring data, and status or warning data such as over current data over-voltage, or over-temperature data (sent real-time). As previously mentioned a packet type flag may be used to indicate real time data such as switch control/acknowledgement data, for example a zero defining a real-time packet and a one defining a non-real-time packet. In embodiments an additional packet type bit is employed to define a packet sub-type, in particular for non-real-time data packets. Non-real-time data packets may comprise, for example, configuration or monitoring data. Since this latter data type may employ larger payloads, optionally one or more sequence data bits may be employed to define a NRT message. Referring now to FIG. 3c, this shows schematic sketches of collector current $I_C$ and collector current emitter voltage $V_{ce}$ against time for an IGBT as it moves through the 6 states previously described starting with an initial switch-on command and ending with switch-on complete at hold state 6. Thus, as can be seen, in the initial free OFF state 1 $I_C$ is at 0 amps and transitions to $I_{min}$ at hold state 3, which may be of order 0.1-1 amp, then increasing towards a maximum during transition state C. Also during transition state C, $V_{ce}$ falls to a low voltage $V_{min}$ (at state 4), for example of order 10-50 volts, that is greater than the saturated-on saturation voltage. During transition state D, $V_{ce}$ falls to the final, saturated-on saturation value $V_s$ which may be, for example, of order 1 to 5 volts. Thus at hold state 6 the device is saturated ON. The switch OFF sequence is essentially the reverse of that illustrated in FIG. 3c.

Broadly speaking, and as previously outlined, the task of the Central Controller is to orchestrate the switching of all Switch Devices in a power converter. It does this via a two level communication system:

A real-time (RT) data packet system that ensures the timely arrival of real-time state-change commands and the return of real-time status and fault flags.

A non-real-time (NRT) messaging service is used for configuring Switch Devices and transporting time-stamped monitoring data back to the Central Controller.

The Central Controller has a number of ports which can be arbitrarily connected to Switch Devices or Sub-Controllers, but preferably each port maps in some way to the topology of the converter. The ports on the Central Controller are addressed in hardware, and as such, data packets may be sent out and received on these ports independently and asynchronously to one another.

As described previously each port has two channels, "A" and "B", for redundancy; these can also be used independently. The Central Controller has the capability to orchestrate simultaneous NRT (non-real-time) message transactions. This dual channel set-up can also be used to assist with RT data error checking: The switch devices receive the same RT data on two channels simultaneously and each switch device compares these two received packets to ensure the RT data is identical before committing to an action. The Central Controller can also apply this approach to received packets, since the RT data part of the packets should be identical. It should be noted however the NRT part of the packets from channels A and B will not be the same if they are being used independently for NRT message transactions to different devices on the same port.

In embodiments all ports may be half-duplex: a data packet is sent from the Central Controller to Sub-Controllers and Switch Devices, and a return packet is then sent from all of the receiving Switch Devices to the Central Controller. This is one complete packet exchange. The Central Controller initiates the packet exchanges and the Switch Devices are given a time window within which to send their reply.

The NRT messages are handled in a similar way: The Central Controller initiates a message transaction by exchanging a series of data packets until a complete message is sent. The message may contain the address of a single Switch Device, Sub-Controller, or of a group of Switch Devices. The addressed device(s) process the message and may reply with their own message (but only one device may reply on one hardware port/channel at any one time). Thus the Central Controller keeps the port/channel open awaiting the reply from the Switch Device that received the NRT message if a reply is expected. When the Switch Device has sent a reply message, the message transaction is complete.

The Central Controller may have to wait for the Switch Device to send a reply message, during which time the port/channel is locked and may not be used to send or receive NRT messages to or from any other Switch Device. However, the Central Controller is free to have other message transactions simultaneously open on the other available hardware ports and channels.

Broadly speaking the function of the Sub-Controllers is to pass on data packets from the Central Controller to the Switch Devices, and merge the data from the returning data packets. This task is preferably performed quickly, on a bit-in bit-out basis, without waiting for the complete data packet to arrive. The Sub-Controllers may alter the contents of the out-going packet data on a bit-by-bit basis to perform tasks in either direction.

Again, each sub-controller has a number of ports with, in embodiments, each port having two channels, "A" and "B", for redundancy. As such, the Sub-Controllers and Central Controller may have similar interfaces and/or comprise similar hardware. In embodiments power and communications is routed through these port connections.

In embodiments an addressing scheme (described later) ensures each Sub-Controller and Switch Device has a unique address. Selection of channel A or B is preferably carried out automatically by the Central Controller and is not part of the addressing scheme (since both channels route to the same end Switch Devices). Even though the first tier of ports in the Central Controller is addressed via hardware routing, this first level enumeration is preferably included in the message address for the purposes of routing and checking.

By way of example, to address a system with a 4-level communications architecture, a 20-bit address is employed. An inverter with 3 phase-legs might be configured as follows:

Level 1: Central Controller Ports 1→4 connect to four Primary Sub-Controllers on half-phase-leg 1H, ports 5→8 connected to four Primary Sub-Controllers on half-phase-leg 1L, and so on for phases 2 & 3 (i.e. ports 1→24).

Level 2: Primary Sub-Controllers each connect to 24 Secondary Sub-Controllers (i.e. 1.1→24.24).

Level 3: Secondary Sub-Controllers connect to a further 24 sub-levels, making 2304 levels in total per half-phase-leg (i.e. 1.1.1→24.24.24).

Level 4: Tertiary Sub-Controllers connect to 24 paralleled Switch Devices each, making a total of 331776 connected Switch Devices (i.e. 1.1.1.1→24.24.24.24).

Such a system represents a level of connectivity suitable for creating a +/−1 MV HVDC system with 2400 A capability out of 1 kV/100 A Switch Devices.

Note that this addressing scheme is for NRT messages only and, in embodiments, is not used in RT data packet delivery.

In embodiments all Switch Devices receive all data packets on a given Central Controller port and then reply with their own data packet (which the Sub-Controllers merge en-route back to the Central Controller). Only one Switch Device per Central Controller port/channel is permitted to reply with a packet that contains non-null NRT data at any one time. If this does occur, then Sub-Controller that receives the two NRT data chunks inserts a logic 1 "Merge Error" flag into the return packet to alert the Central Controller that a communication error has occurred. (A data chunk comprises one or more bits and may be less than a byte or an 8-bit byte).

Similarly in embodiments all messages on a given Central Controller port are received by all Switch Devices.

As previously described, each Switch Device contains a combination of digital and analogue circuitry to ensure the power device (IGBT or MOSFET) moves through each of the 6 switch states.

If a switch contains only a single Switch Device there may be no need for the ACTIVE_LOW_CURRENT and ACTIVE_LOW_VOLTAGE states as these are used to synchronise multiple Switch Devices.

State 3: ACTIVE_LOW_CURRENT is used when there is a high voltage across the power devices. This controlled low current state ensures there is low power dissipation during turn on when the power device is active.

State 4: ACTIVE_LOW_VOLTAGE is used when there is high current flowing in the power devices. This controlled low voltage state ensures there is low power dissipation during turn off when the power device is active.

Figure 4A:
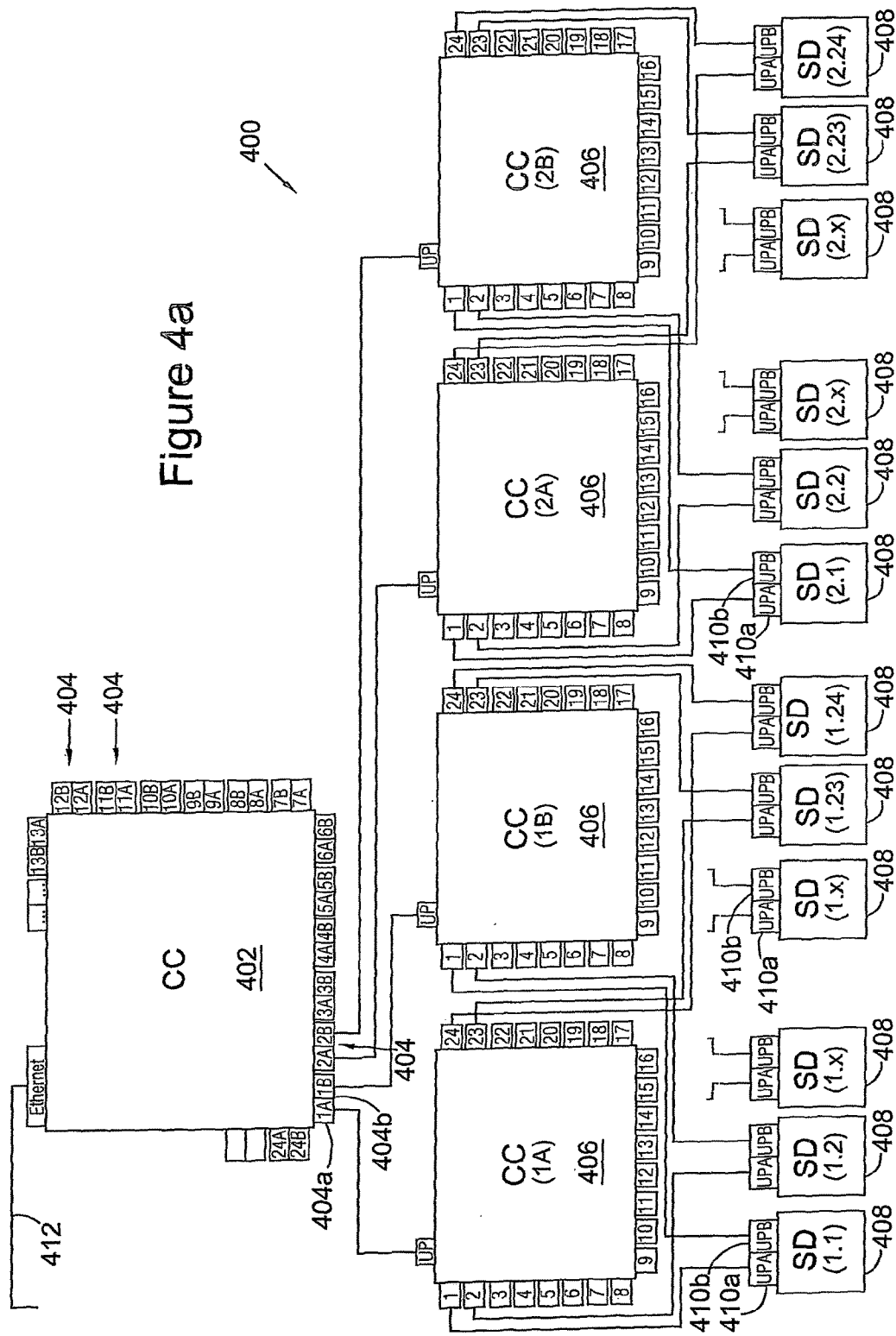
FIGS. 4a and 4b show, respectively, first and second example communication topologies for power semiconductor switching device control systems according to embodiments of the invention.

Referring next to FIG. 4a, this shows the topology of a first example topology of a power semiconductor switching device control system 400, illustrating a first arrangement of redundant channels. In the example of FIG. 4a a central controller 402 has a plurality (for example 30) of logical outputs/inputs 404 each split into a pair of redundant channels A and B 404a, b. The system also includes a plurality of sub-controllers 406, separate sub-controllers handling the A-channels and the B-channels, to provide redundancy in case of a sub-controller failure, each switching device controller (SD) 408 has two redundant inputs/outputs 410a, b, one for each of the A and B channels. In embodiments multiple layers of sub-controllers may be employed, for example up to three layers of sub-controller.

In the illustrated example, the connections between each device/controller are high speed point-to-point links, but in alternative arrangements a shared bus may be employed between the central controller and the sub-controllers. In one embodiment a connection comprises a twisted copper wire pair; the same pair or an additional pair may be employed to provide a power supply to the switching device controllers. Alternatively a fibre optic connection may be employed between the central controller and sub-controller(s) and/or to/from a switching device controller. Such arrangements enable high speed data transfer, for example greater than 100

Mbit/s or 1 Gbit/s. A network connection 412 is also provided to the central controller 402 for overall configuration/control of the system; in embodiments this may be an Ethernet connection.

Figure 4B:
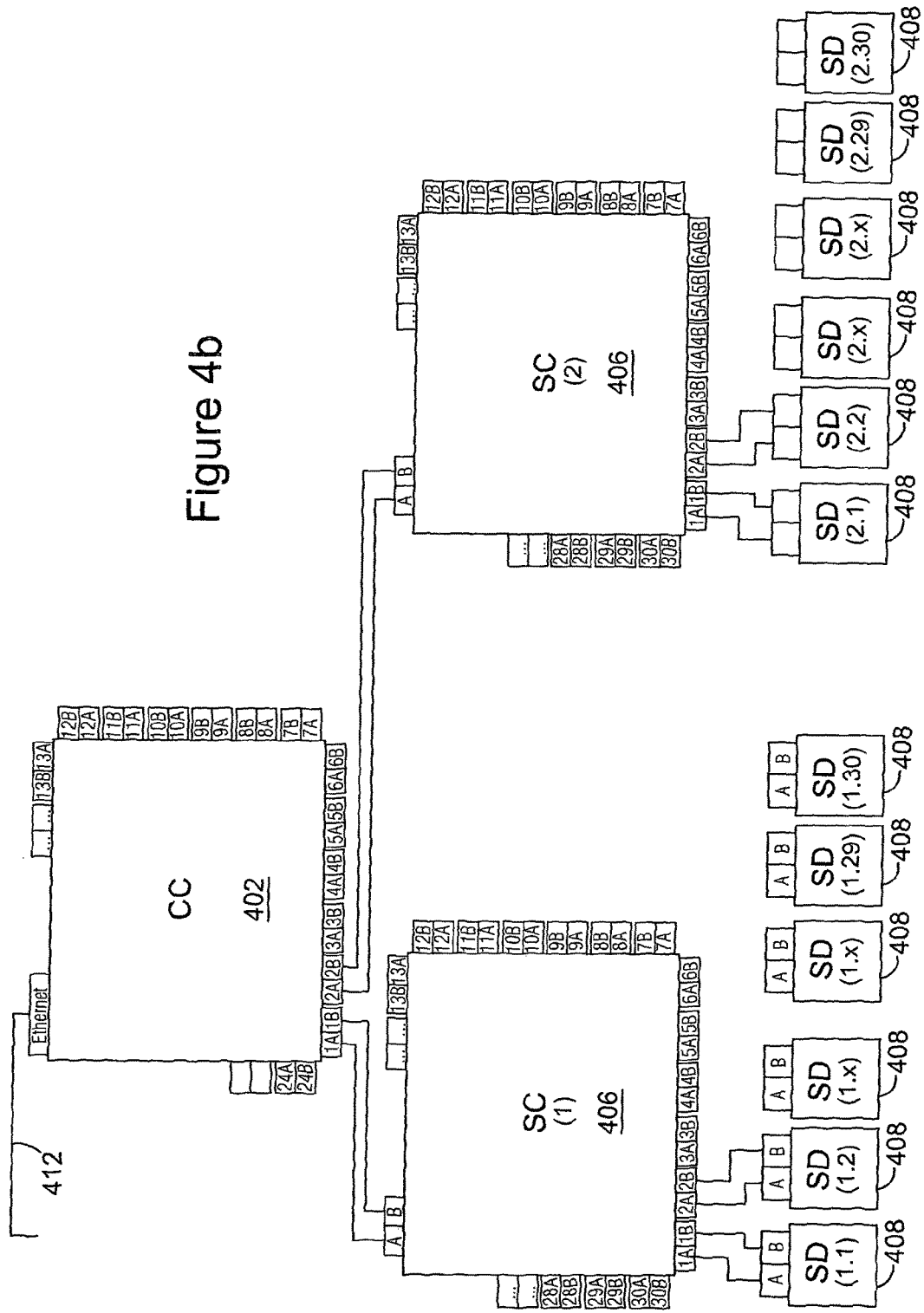

FIG. 4b, in which like elements to those of FIG. 4a are indicated by like reference numerals, illustrates a second example topology in which both the A and B channels from the central controller to a switching device controller are handled by the same sub-controller. Although this reduces the redundancy it has some other advantages, such as simplified wiring and a reduced chance of a device being connected to different addresses on networks A and B. Either topology may be employed.

From the above description the skilled person will appreciate that the topology of the switching device control system allows a single central controller to control, potentially, a large number of power semiconductor devices via a tree structure, where each node in the tree is allocated an address, as described later, to facilitate passing non-real time messages. A communications protocol operates over this tree, preferably to provide the following features: a mechanism for transmitting short real-time requests from the central controller to the switching device controllers, and to receive an indication of when such a request has been completed, with as small as possible overall communications latency—to synchronise the switching of a group of power semiconductor switching devices. A mechanism for the central controller to receive high-level fault information from the switching device controllers, again preferably with as short a delay as practicable—this is used to detect fault conditions in order to take corrective action. A mechanism for the central controller to interrogate the switching device controllers (SDs) and sub-controllers (SCs) for fault diagnosis, initial device configuration, and to read measurement data for fault prognosis and the like—this may employ longer potentially multibyte transactions and need not be 'real-time'. The communications protocol will in general be operating in an electrically noisy environment, with a relatively high degree of electrical isolation between communicating nodes.

In order to support the low-latency real-time requirement the protocol uses a short frame structure and a request/response protocol. The CC sends a single frame out to all devices, the SC forwards this on to all its output ports, the SDs receive this. The SDs send an immediate response, the SCs receive these from all ports and merge before sending the merged response back to the CC. This is asymmetric: the SCs receive a single data frame from above and broadcast it out on all ports; they receive multiple data frames from below and merge these together before sending a single frame upwards.

The short frame length used for low-latency does not directly enable the NRT (non-real time) messaging where a request or response might require multi-byte packets to be transmitted. In order to achieve this, a higher-level protocol is required where an NRT transaction is split over many short frames.

An example low-level frame structure is described later; some features are:
  the downstream (CC to SD) and upstream (SD to CC) frames are different, both in contents and in their size.
  both frames contain a Hamming code to allow for error detection and correction.
  a type bit (T) in the downstream frame indicates whether it contains real-time (RT) and non-real-time (NRT) data.
    the upstream frame contains both RT and NRT data (i.e. there is no type bit).

The CC is responsible for prioritising RT traffic over NRT traffic at all times. Thus a state change will take priority over NRT data. A SD does not prioritise sending (RT) fault data over sending NRT data (since otherwise a node that was in a fault state could not be examined using the NRT mechanism) and so both RT and NRT data are present in the upstream frame.

The choice of a Hamming code (over the more conventional CRC) is to reduce the delay within the SC when it is merging frames from below and to provide a degree of error correction.

Real-time requests are sent from the CC to all devices within a real-time group (of which there are 32 in one embodiment). The request is that all SDs in this group should either change switching state, or should perform some real-time action. The real-time response contains "state change in progress" and "action in progress" bits to indicate when the switch or action has completed, and fault flags to indicate the fault state of the SD.

SCs performs an OR operation on these bits from all downstream nodes in order to provide a "subsystem status" to the CC. If the CC issues a state change it can determine that all devices have completed that operation when the SIP bit becomes clear. An example RT frame is described later.

In embodiments, the round-trip delay time for a real-time packet is less than a time taken to transition between two (intermediate) states of the switching device. It is further preferable that the round-trip delay time is not greater than a failure time for the switching device; preferably the round-trip delay time is of order ten times less than this. A typical failure time is ~1-10 μs (for example a short circuit time can be determined from the device datasheet; this may be dependent on the operating conditions of the device). In general the state of a switching device changes on a timescale ~1 μs and it is therefore preferable that the signalling is able to operate faster than this.

Non-real-time requests are transmitted as multiple frames on the network. The NRT frame structure contains 8-bits of data and a bit to indicate whether this is an ordinary data byte, or is a control byte which indicates the message structure (e.g., a START or STOP signal, or a PAUSE used for flow-control). The downstream NRT frame also contains a sequence number (the asymmetric nature of the bus means this is not required upstream).

In embodiments only a single SD/SC can respond to a NRT request at a time so that data is not destroyed when merged at a SC. All other devices transmit a NULL-control packet that is defined to have all zero bits and thus can be merged harmlessly.

The CC uses the NRT layer to access registers within the SDs. The NRT message contains the NRT device address together with the type of operation (read or write) and the register address to access. For a write operation the data to write is also transmitted; for a read operation the number of registers to read is transmitted. The response from the SD/SC contains a status and, in the case of a read request, any required data.

The NRT addressing model preferably includes broadcast and group addresses to allow operations to apply to multiple nodes. The preferable restriction that there should be only one transmitting SD/SC means that a SD/SC should not transmit data in response to a group request; these requests are therefore only used for write operations, for example, for initial configuration of a group of devices.

Figure 5A:
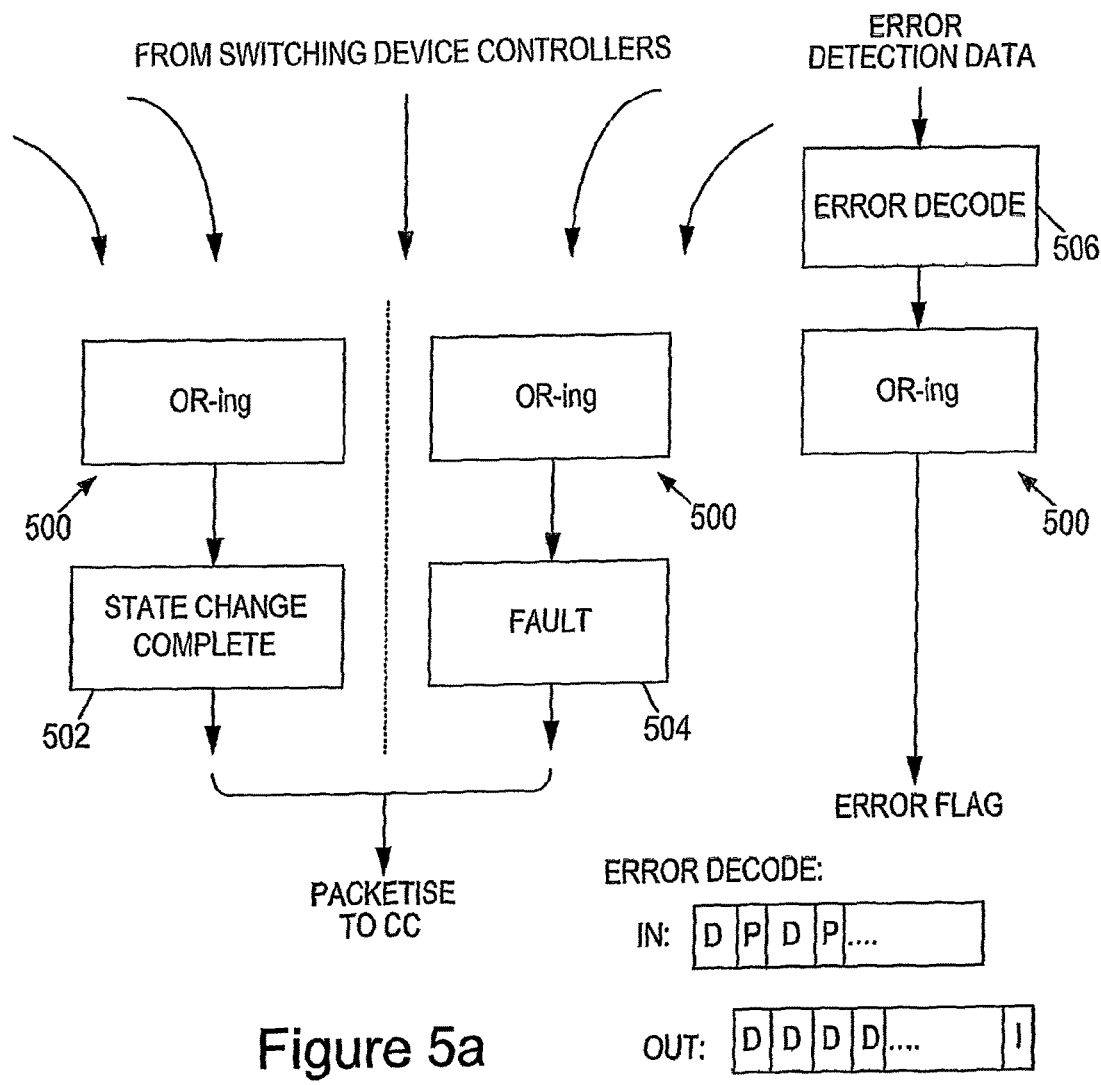
FIGS. 5a to 5c show, respectively, a conceptual illustration of a scheme for processing data packets at a sub-controller sent by a plurality of switching device controllers connected to the sub-controller, an example illustration of device addressing within a small control system network, and a block diagram of a sub-controller for a power semiconductor switching device control system according to an embodiment of the invention.

Referring now to FIG. 5a, this conceptually illustrates merging of data packets received at a sub-controller from a plurality of switching device controllers. State data from the switching device controllers is represented by a set of RT (real-time) flags, in embodiments 6 flags as previously described. This is ORed 500 together to merge the data from, potentially, up to of order $10^4$ devices. This is because a transition (SIP) bit is provided which, during a transition, is active. Thus ORing the state data from the switching device controllers together indicates when all of the devices have reached the subsequent state because only then will none of the devices have the SIP bit set. In this way a state change complete 502 determination may be made. In an embodiment employing serial data communications at a bit rate of, say, approximately 1 Gbit/s each real-time packet takes approximately 24 ns to arrive and thus the state change complete determination may be made very quickly. The skilled person will appreciate, however, that parallel or partially parallel rather than serial communications may alternatively be employed using the same approach.

In embodiments the data from the switching device controllers also includes fault data in which one or more bits is active (either high or low) to indicate a fault. Again this fault data may then be ORed 500 together to identify for the set of switching device controllers whether or not a fault is present 504. The resulting state change complete, and optional fault data may then be forwarded to the central controller, in embodiments after being assembled into one or more data packets.

In embodiments the data received from the switching device controllers also includes error detection data, in embodiments parity data for a hamming code. Then the procedure includes an error decoding process 506 to decode the hamming code, which may then be tested in order to detect an error in an acknowledgement data packet from any of the switching device controllers in the relevant branch of the tree. An error flag may then be set accordingly in the packet to the central controller. The skilled person will appreciate that there are alternative approaches which may be employed for handling the error detection data, in particular because merging this data potentially hides which switching device controller acknowledgement packet contained an error (although, preferably, the pre-merged data may be locally stored for interrogation to identify this). In some preferred embodiments error detection data is also included in the data forwarded from a sub-controller to the central controller; in embodiments this provides a facility to detect a two bit error and correct a one bit error (on the sub-controller to controller link).

FIG. 5a also illustrates, conceptually, that where the parity bits are included within the state or other data sent from a switching device controller then the incoming data may be error checked as it arrives, reducing the error decode latency. This is because by the time the final portion of the incoming (serial) data has arrived some of the error decoding has already been carried out and therefore there may only be a small additional delay to determine whether the complete packet is either good (valid) or invalid, in the latter case a one bit error flag, E, being appended to the data out of the error decode process 506, prior to ORing. In embodiments there may be an error decode latency of 1-5 bits, which at one bit per nanosecond is generally small compared with the propagation delay of signals within the control system. Most importantly, because since each bit is forwarded before the whole packet has been verified, a mechanism is needed to flag when a packet, after it has mostly sent out is in error. This is provided by an appended error flag which is covered by the last three bits of the Hamming code.

In embodiments the acknowledgement data received by a sub-controller from a switching device controller comprises a 24 bit frame. A sub-controller may receive, for example, 30 such frames, which are merged by ORing the data bits to determine the sub-system status. In embodiments one communications channel is provided for each switching device controller; this may be implemented as one or more 'wires' or fibre optic cables. As previously mentioned, a real time acknowledgement data packet comprises, inter alia, six flags. In the other direction, a switch state or other command sent to a switching device controller (node or SD) includes a group address, in embodiments comprising 5 bits. Such command packets are broadcast from the central controller and forwarded by the one or more sub-controllers to the switching device controllers, which interpret the command and, for example, change state accordingly. Alternatively, however, a parallel bus arrangement may be employed without the need for data packets or in embodiments such addressing techniques.

We will now describe in more detail an example preferred implementation of the data link layer Data Link Layer Broadly speaking, the data link layer provides an unreliable broadcast datagram service from CC to SDs and an unreliable unicast datagram service from SDs to CC (SDs cannot communicate directly between themselves, all communication is controlled by the master). The general format of the data frame from a controller to a node (CC→N), and vice versa (N→CC) is as follows:

| Direction | Packet type | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| CC->N | | | | | | | | | | T | D9 | D8 | D7 | D6 | D5 | D4 | P4 | D3 | D2 | D1 | P3 | D0 | P2 | P1 | P0 |
| N->CC | | F5 | F4 | F3 | F2 | F1 | F0 | D9 | P5 | D8 | D7 | D6 | D5 | D4 | D3 | D2 | P4 | D1 | D0 | ME | P3 | E | P2 | P1 | P0 | where the following abbreviations are employed:
T Packet type
P[5:0] Parity
F[5:0] RT Flags
D[9:0] Data
E Error
ME Merge Error In the outbound packet (CC→SD), the data may be RT or NRT data based on the T (type) flag. In the inbound packet (SD→CC), both RT and NRT data are present. The RT data comprises a set of flags used to transmit critical information from the SDs to the CC. The Parity bits P[5:0] and P[4:0] are a SECDED ("single error correction, double error detection") Hamming code. The error bit, E, is set if a node received a bad packet. This can be a SD receiving a corrupted packet from the CC, or a SC receiving a corrupted packet from a SD. The error bit is sent late in the upstream packet so the SC can report a fault if the incoming upstream packet is in error (this requires a delay of a few bits in the SC since the E bit cannot be transmitted until the last parity bit has been received and checked). The merge error bit, ME, is set if sub-controller received non-null NRT data from two or more downstream devices. (This should only occur if there are two devices with identical addresses.)

The protocol has a request-response pattern: for every sent packet by the CC there is a received packet from the SDs. The CC is responsible for ensuring that RT traffic is prioritised over NRT traffic.

All the packets from the CC are forwarded by the SCs to all the SDs. When the packet is received by an SDs, the Hamming code is checked.

If a single bit error is detected, the error is corrected and the content of the frame is forwarded to the related upper layer based on the T flag. A single bit error counter is incremented for statistical purpose.

If a double bit error is detected, the content of the frame is dropped and the E (error) flag is set in the reply packet. In every case (if the frame is corrupted or not), an outbound packet is sent back to the CC.

If the CC receives a frame with the E flag set, then the previous frame is retransmitted until the reply frame has the E flag cleared or a retry counter expires.

If the reply frame received by the CC is corrupted and it can't be corrected (2 bits error), the content of the received packet can't be trusted and the CC sends the packet again.

Optionally frames may be dropped if a single-bit error is detected (a case in which it is possible to correct the error) as this reduces the probably of accepting an erroneous frame.

Each frame has a SECDED ("single error correction, double error detection") Hamming code. For the outbound communication, each SDs has the capability to detect and correct single bit error. This is used to avoid retransmission on single bit error, since due to the huge number of SDs and to the high speed communication this type of error is likely to occur.

Sub-controllers send the downstream data CC→SD out to all output ports with minimal delay (i.e., without waiting for an entire packet to be received). As packets are going upstream from the SD to the CC, as previously described, every SC makes the OR function of: F[5:0], D[8:0] and E. The SC transmits the correct parity bits (P[5:0]) for the outgoing data (the parity bits are not OR'd together).

We now consider RT layer data packets. These have the format below:

where the following abbreviations are employed:
G[4:0] Group address
S[3:0] Switch status
A[3:0] Action
RT Packet type
(for RT Packet Type, 0=RT state i.e, the switch state sent to the node (SD) from the CC; 1=RT action)
OC over-current
OV over-voltage
XX spare
CE Communications Error
AIP Action In Progress
SIP Switch status change In Progress The group address is used to send RT data to different groups of SDs, for example different levels of a multilevel inverter. Group 0 is the broadcast group. Devices only act on RT requests where they are members of the RT addressing group. A group address is sent to the SD using NRT data packets and is made active using a RT action command packet. The switch status is a 4-bit number representing the desired switch state for the SD group.

The action command is a 4-bit number; example actions are: Reset device to power-on-status; Reset the NRT communications system; Apply the configuration stored in the device "shadow registers". Bits from 23 to 18 are a set of flags used to transmit time critical information from the SDs to the CC.

The AIP and SIP flags are set when a SD receives a RT action command or switch status change. When the action or the switch status change is completed, the flag is reset. Due to the flags OR-ing of the SCs, the CC knows if at least one SD has not yet completed the action/change.

The RT data packet contains a set of fault flags (OC, OV and so forth) reporting the state of the set of SDs. Example faults which may be reported include over-current (desaturation), over-voltage, failure to establish an ON (or OFF) state (which may indicate a faulty gate drive), over-temperature, and a state in which the switching device controller is continually in a voltage-clamping state (which may indicate a fault elsewhere in the control system).

If an SD has a fault, for instance an over-voltage fault, a bit is set in the RT data and this is transmitted up to the SC. The SC performs an OR operation and sends this onwards. When the data arrives at the CC the information available is that there is a fault somewhere in the network, and the NRT data channel is then used to determine exactly where this fault is, for example by interrogating individual devices.

Each SD has a register that may be read to check its fault status. However in embodiments the latest fault status from every downstream port is cached by SCs and the location of a fault can then be determined by walking down the SC tree guided by the fault-status registers. On detection of a fault, part or all of the system can, if desired, be returned to a previous known good state by controlling the nodes to step

| Direction | Packet type | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| CC->N | RT state | | | | | | | | | | RT | G4 | G3 | G2 | G1 | G0 | | S3 | S2 | S1 | | S0 | | | |
| CC->N | RT command | | | | | | | | | | RT | G4 | G3 | G2 | G1 | G0 | | A3 | A2 | A1 | | A0 | | | |
| N->CC | | | OC | OV | XX | CE | AIP | SIP | | | | | | | | | | | | | | | | | | | back through the transitions and states which were taken to the faulty state (or alternatively move forward to a subsequent "safe" state).

We next consider the NRT transport layer, in which data packets have the following format:

| Direction | Packet type | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| CC->N | NRT data | | | | | | | | | | NT | S | | D7 | D6 | D5 | D4 | | D3 | D2 | D1 | | D0 | | | |
| CC->N | NRT control | | | | | | | | | | NT | S | | C7 | C6 | C5 | C4 | | C3 | C2 | C1 | | C0 | | | |
| N->CC | NRT data | | | | | | | NT | | | POR | | D7 | D6 | D5 | D4 | D3 | D2 | | D1 | D0 | | | | | |
| N->CC | NRT control | | | | | | | NT | | | POR | | C7 | C6 | C5 | C4 | C3 | C2 | | C1 | C0 | | | | | | where the following abbreviations are employed:
D[7:0] Data
C[7:0] Control
NT Packet type
S Sequence flag
POR Power-On/Reset The NRT packet contains either an 8-bit data byte or an 8-bit control code. The Power-On/Reset bit, POR, is set if a device has been powered on or reset and remains set until the device has an address assigned to it. (This enables the CC to detect when a device is attached to the system during operation.) The control bits signify, inter alia, the start and end of packet (which is composed of a variable number of NRT data frames payload and which may have up to, say, 64 bytes).

The sequence flag is used to provide a reliable broadcast datagram service. When a NRT frame is received, the S flag of the frame is compared with the internal sequence flag within the receiving node. If the two flags are not equal, then the data coming from the outbound frame is ignored otherwise the new data is inserted in the inbound frame and the internal sequence flag negated.

The NRT communication protocol makes the use of 20-bit device addresses. There are three classes of address:

1. A "device addresses" take the form a.b.c.d where the first component is 1.30, and all other components are 0.30. This address defines an individual device.

2. A "wildcard address" is as a device addresses, but one or more of the components take the value 31 which means "any device". For example 1.2.31.0 refers to all devices 1.2.x.0 where x is 0.30.

3. A "group address" takes the form 0.x.y.z where the 15-bit number xyz identifies a group of devices.

Figure 5B:
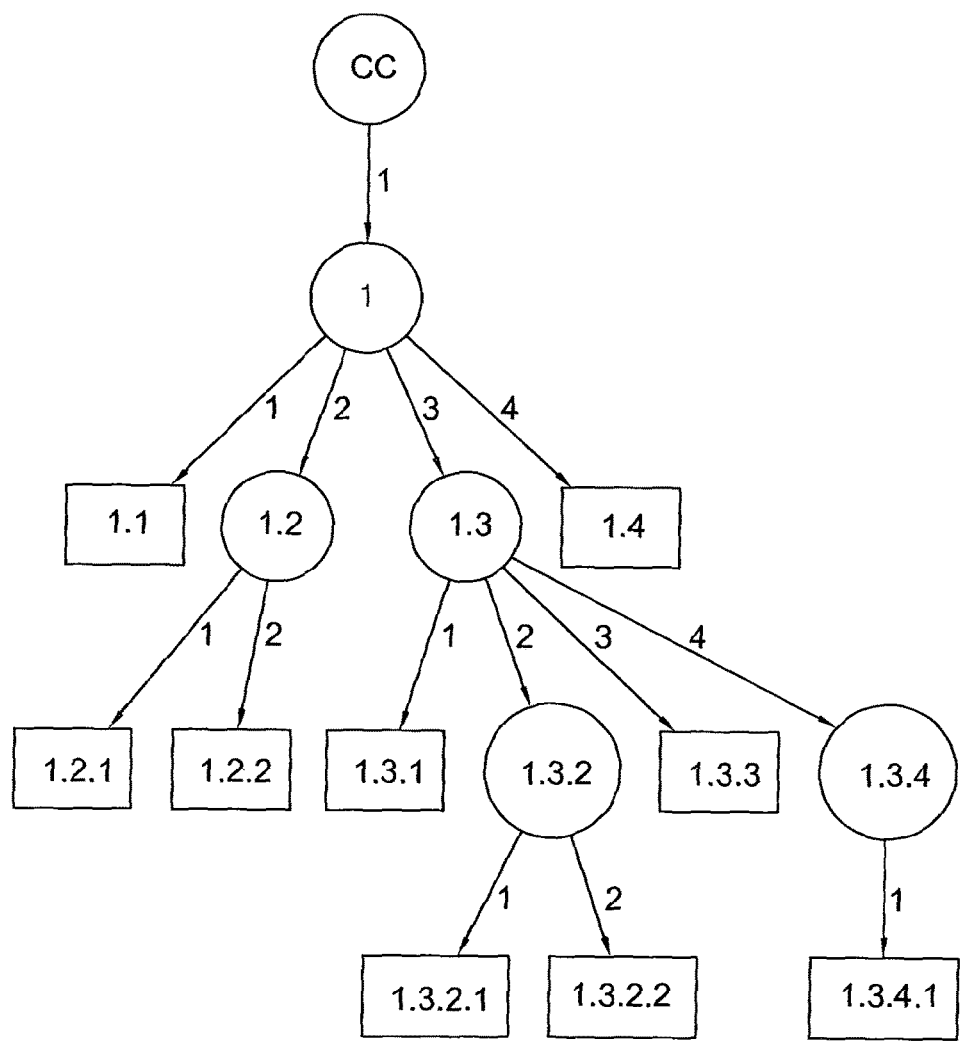

All slave devices (i.e., not the central controller) have a single device identifier. The central controller is responsible for assigning address devices based on their location in the network. Referring to FIG. 5b, this shows a small network attached to a single central-controller output port (port 1) to demonstrate the addressing scheme. Circles represent sub-controller nodes, rectangles represent individual devices. At each layer in the diagram a digit is added to the address.

Wildcard addresses enable addressing a group of nodes based on their location in the tree. The wildcard part of the address is indicated with the value 31 (which is an invalid port number). For example:

1.31.0.0.0 will address all devices connected directly to the central controller.

2.31.31.0.0 will address all devices in the first and second levels of the tree.

3.1.2.3.31 addresses all devices connected to the sub-controller with address 1.2.3.0.

4.31.31.31.31 addresses all devices on the network.

Group addresses allow for the addressing of devices based on dynamically managed groups. These groups may be managed by the central controller setting the group address registers within devices, or may be based on a property of the device (for example, whether a NRT address has been assigned to the device). The following groups are predefined:

| Name | Address | Purpose |
|---|---|---|
| GROUP_ALL | 0.0.0.0 | Broadcast to all devices (same as 31.31.31.31) |
| GROUP_HAS_ADDRESS | 0.0.0.1 | Broadcast to all devices that have a value NRT device address. |
| GROUP_NO_ADDRESS | 0.0.0.2 | Broadcast to all devices that have not yet been assigned an NRT address. This is used during the enumeration protocol. |

A device enumeration scheme is used when assigning addresses to devices. Before an address has been assigned to a device it cannot be individually addressed, it can only be accessed using a broadcast/group address. Therefore an algorithm is used that ensures that if a group address is used to set a device address, that the group contains that device and no other. This is done by manipulating the set of enabled NRT output ports on sub-controllers. The algorithm executes on each CC output port, N, and assigns addresses N.a.b.c to the nodes. The algorithm begins with the following steps:

1. Send Reset action to the broadcast RT group (thus all nodes have addresses cleared, and all SC outputs are closed to NRT traffic).

2. Assign address N using the group address GROUP_NO_ADDRESS (this node is either a SD, or a SC with all outputs disabled, thus only one device responds).

3. Perform the "enumeration algorithm" below starting with address N.

The enumeration algorithm is recursive on the devices, beginning with address N. The procedure reads the device type and if the device is not a SC the algorithm ends. Otherwise, if the device is a sub-controller: disable all output-ports on the SC, then for each output port, i:

1. Enable output port i.

2. Assign address to the device i using the group address GROUP_NO_ADDRESS.

3. Run the enumeration algorithm on device i (a depth-first-search down the tree).

4. Disable output port i.

Then enable all output ports.

Figure 5C:
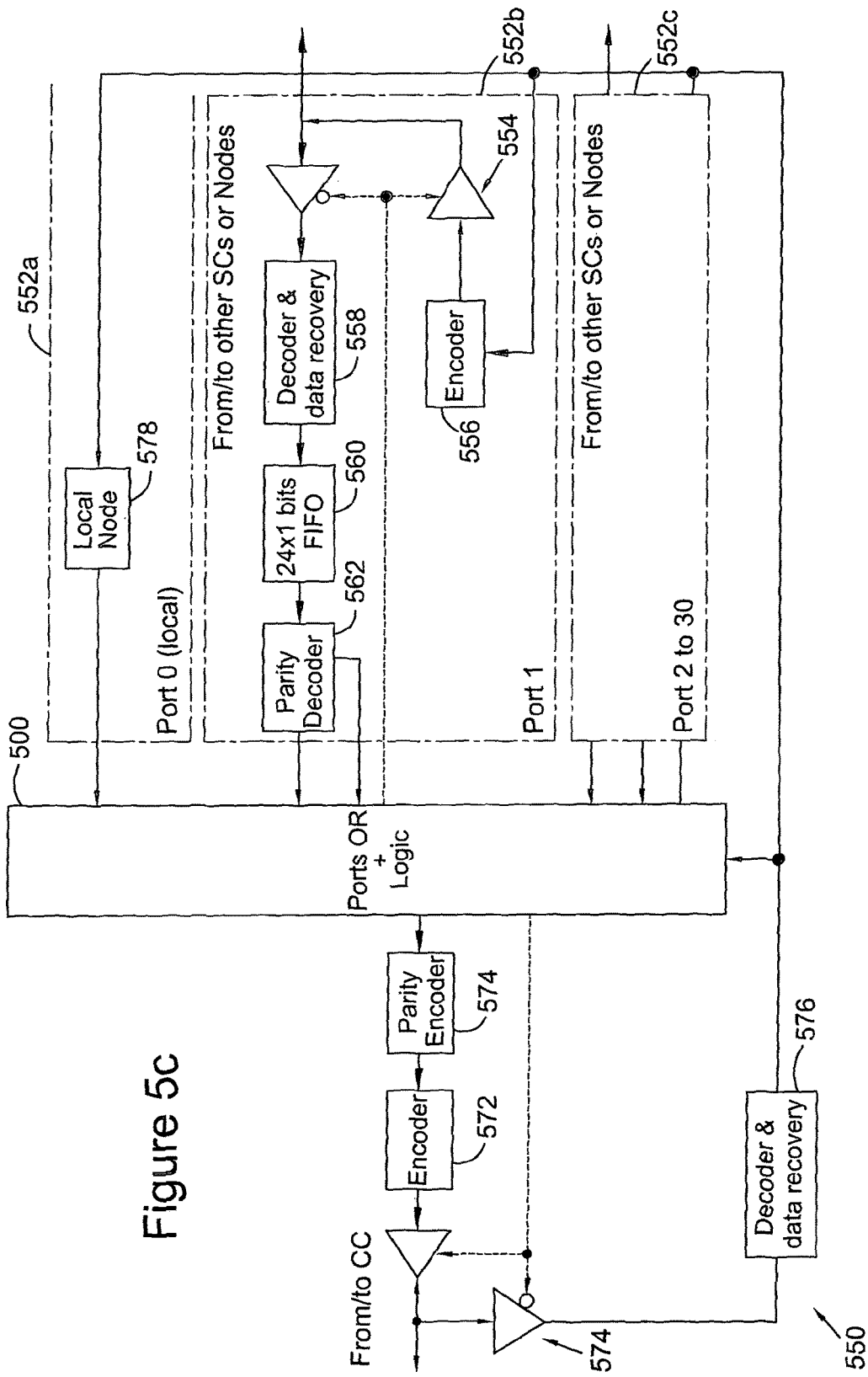

Referring now to FIG. 5c, this shows a block diagram of a sub-controller 550 arranged to implement the techniques described above, according to an embodiment of the invention. Thus the sub-controller comprises a set of ports 552*a-c* each of which (apart from port 0, which is local) comprises data transceivers 554, an encoder 556 for transmitted data, a decoder and data recovery function 558 for received data and, a FIFO 560 and, preferably, a parity decoder 562. The outputs from the decoded received data and from the parity decoder for each port are provided to a port ORing block 500, broadly as previously described, which is then followed by parity and data encoder functions 570, 572, for onward re-transmission to the central controller. A physical interface comprises a pair of data transceivers 574, and the received data is provided to a decoder and data recovery function 576 which provides a clock signal to block 500, and also an input to this block via local port 0. In control systems with more than one sub-controller layer port 574 may communicate with another sub-controller. Thus in embodiments there are 32 bi-directional ports, one 'inbound', 30 'outbound' and one internal. Since, in embodiments each port is half-duplex, in embodiments a pair of buffers is provided for each external port controlled by the sub-controller logic.

In embodiments, in operation one or both of encoders 556, 572 encode a digital I/O level bit stream using a ternary code, for example, the hybrid (H-) ternary code, into 3 levels, positive, zero, and negative. The decoding and data recovery box 558, 576 decode these 3 levels to a two level digital bit stream, and also align the data to an internal clock. FIFO 560 stores incoming data up to a complete frame. The parity decoder 562 checks the Hamming code of the incoming frame. In embodiments port 0 includes a local node module 578, which is an internal node looking similar to other nodes to an SD, used to configure the sub-controller itself.

Inbound data (from the central controller) is sent substantially without modification to all the outbound ports (towards the nodes/SDs) and towards the local port. In doing this the inbound data stream is de-coded to allow the internal sub-controller logic to identify the start of a frame and to drive the buffers accordingly; for the external outbound ports the data stream is then re-encoded before forwarding.

Data arriving from one of the nodes/SDs (and also the internal port) is merged on a bit-by-bit basis. Preferably each incoming data stream from a node/SD (optionally via another sub-controller) is temporarily stored in a FIFO. This is so that there is no need for length matching among cables from the sub-controller to their destination (other sub-controllers or nodes), allowing the incoming data bits to arrive at different times. When the first bit of a frame is stored by the FIFO for all ports, the sub-controller logic starts to read data from the FIFOs, ORing the data stream bit by bit. All the bits are ORed, except for parity bits. In the case of an NRT data packet only one port receives data and the other ports receive a null packet comprising all 0s, so that ORing does not modify the data. If more than one port receives an NRT data packet a merge error is flagged, allowing the central controller to take corrective action. Each bit is then forwarded to the inbound port after a 4 bit delay (see below).

Preferably the merged data stream is forwarded as soon as possible and before the complete frame is stored (and therefore a parity mechanism such as a Cyclic Redundancy Check, with the parity stream at the end of the frame, is not used). In embodiments, the parity bit string is not stored at the end of the frame but it is spread over the frame, and when the tail of a frame is received by the SC, most of the merged frame has already been forwarded towards the CC. A Hamming code parity scheme is used since this is a distributed parity mechanism and when a parity bit (P) is received that bit covers (only) the frame data bits (D) received so far, as shown below:

| D | D | D | D | D | D | D | P0 | D | D | D | D | D | D | D | P1 | D | D | D | P2 | D | P3 | P4 | P5 |
|---|---|---|---|---|---|---|---|---|---|---|---|---|---|---|---|---|---|---|---|---|---|---|---|

Each parity bit can be checked as soon as it arrives and there is no need to wait for the complete frame. This raises the possibility of invalidating the forwarded frame when sending the last data bit (bit 3, Error flag), while it is still covered by the parity scheme. To achieve this, each bit is then forwarded to the inbound port after a 4 bit delay (and so the frame is forwarded with a 4 bits delay). At the end of the frame, the SC receives the last 3 parity bits (P2 to P0) and checks them. Then the SC sets the Error flag if the packet is corrupted (one or two bit error) and calculates a new value for P2-P0 before forwarding the last four bits of the frame.

This protocol provides different error checking/correcting capabilities for the outbound (from the SC) and inbound (into the SC) data flows: In embodiments, for an outbound data flow each SD or SC local node can correct single bit errors and detect double bits errors. For an inbound data flow a single or double bit error can be detected by each SC, but no correction is possible. Thus in embodiments a single bit error can be corrected by the CC only if the frame is corrupted between the CC and a SC connected directly to the CC (as opposed to one connected via another SC).

It is desirable to be able to update the configuration of a switching device controller at a defined time, for example when a switching action is not taking place. However the configuration data may be too large to send in a real-time packet and thus, in embodiments, the configuration information is updated in a two stage process making use of a 'shadow configuration' within each switching device controller (SD).

Figure 6A:
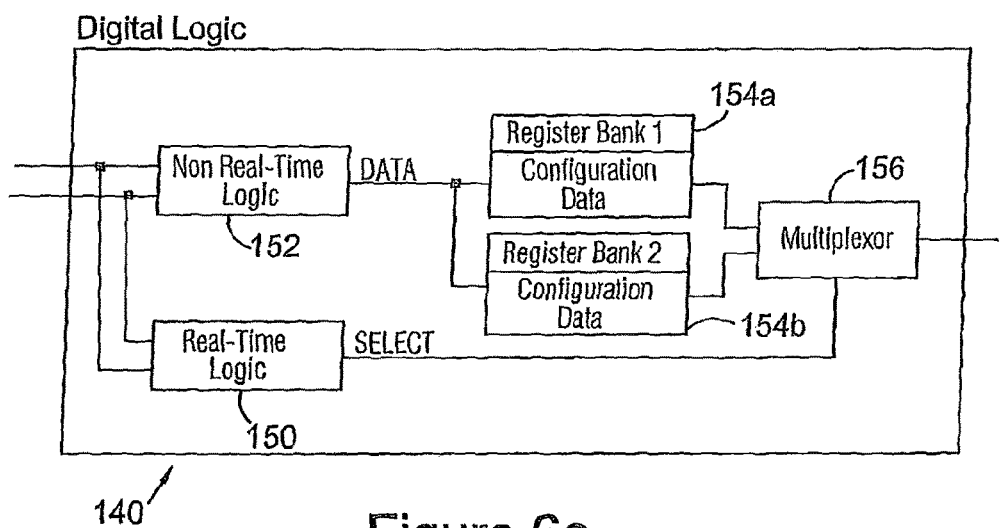
FIGS. 6a to 6c show, respectively, details of a pair of configuration register banks for a switching device controller according to an embodiment of the invention, an illustration of a procedure for writing non-real-time data in data packets sent from the coordinating control system to an addressed device, and an illustration of a complementary non-real-time data read procedure.

Referring now to FIG. 6*a*, this shows details of the digital logic 140 of FIG. 1. As previously mentioned, a switch state is requested by a real-time message from the central controller (and similarly acknowledged when achieved), whilst configuration and monitoring data can be sent and received by non-real-time messages. Thus the interface to bus 122 comprises real-time logic 150 and non real-time logic 152. In embodiments the controller includes two register banks 154*a,b* storing configuration data which is selectable by multiplexor 156. The register banks are programmed by the digital logic, which also controls which register bank is active, and which one can be written to. The register bank that is active provides parameter information that configures the switching device controller. The register bank that is not active can be updated via the communications interface, and then made active so that this new parameter data controls the system state. This enables real-time update of the controller configuration, and synchronised update in a system with many switches/controllers.

Thus in operation one of the register banks functions to store shadow configuration data, and the other to store active configuration data. The shadow configuration is updated for the nodes for which a configuration change is desired, using NRT frames. Changes to the shadow configuration, however, have no effect on the switching behaviour of the device. Then the shadow configuration is copied to the active configuration register bank (or the designation of which is the shadow and which is the active register bank is switched), using a real-time action command. The error bit in the data link layer allows the central controller to detect where one or more devices did not receive this action command, so that the command can be re-transmitted. In one embodiment a register bank comprises 4K 32-bit words of addressable memory.

Figure 6B:
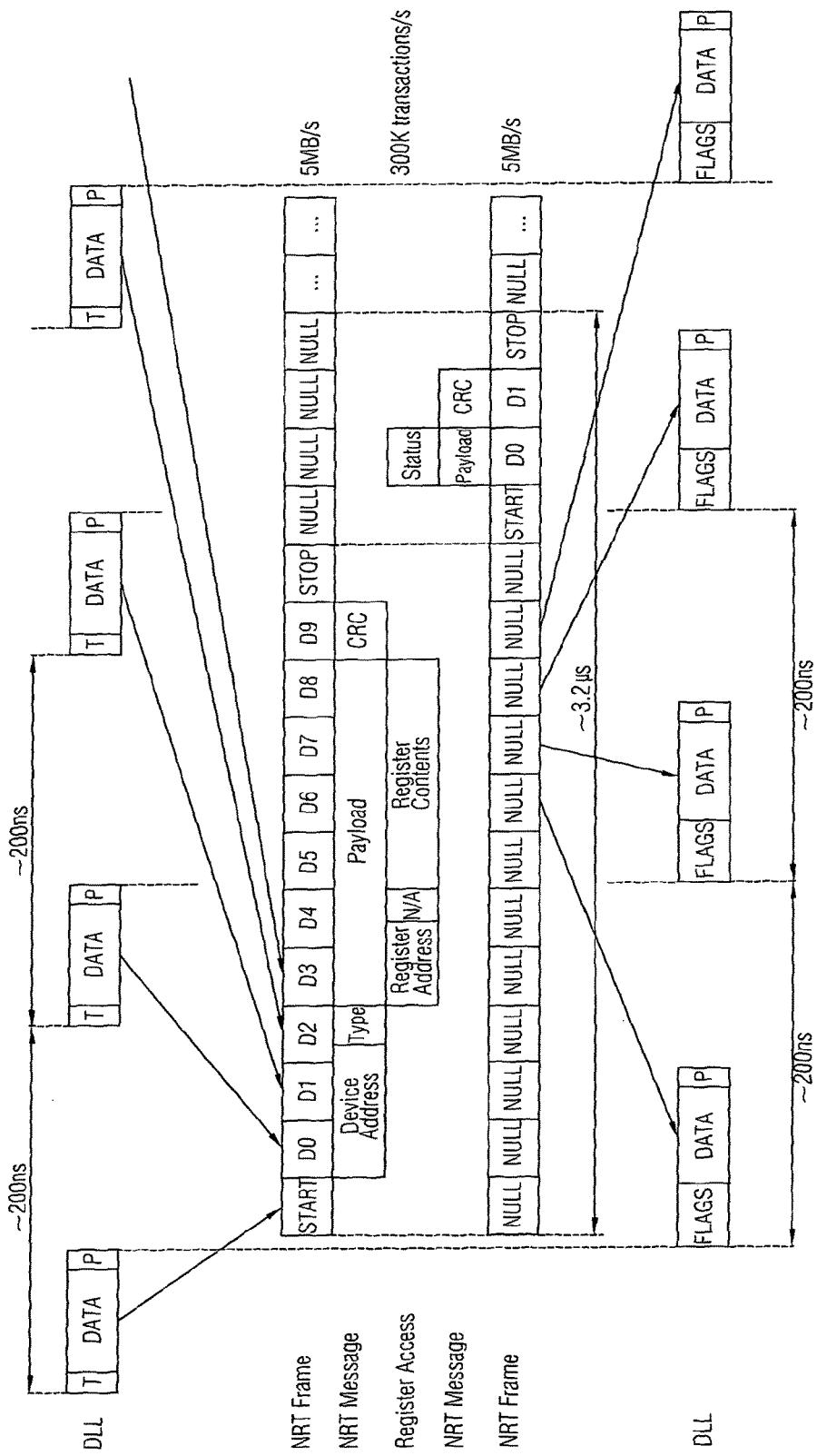
Figure 6C:
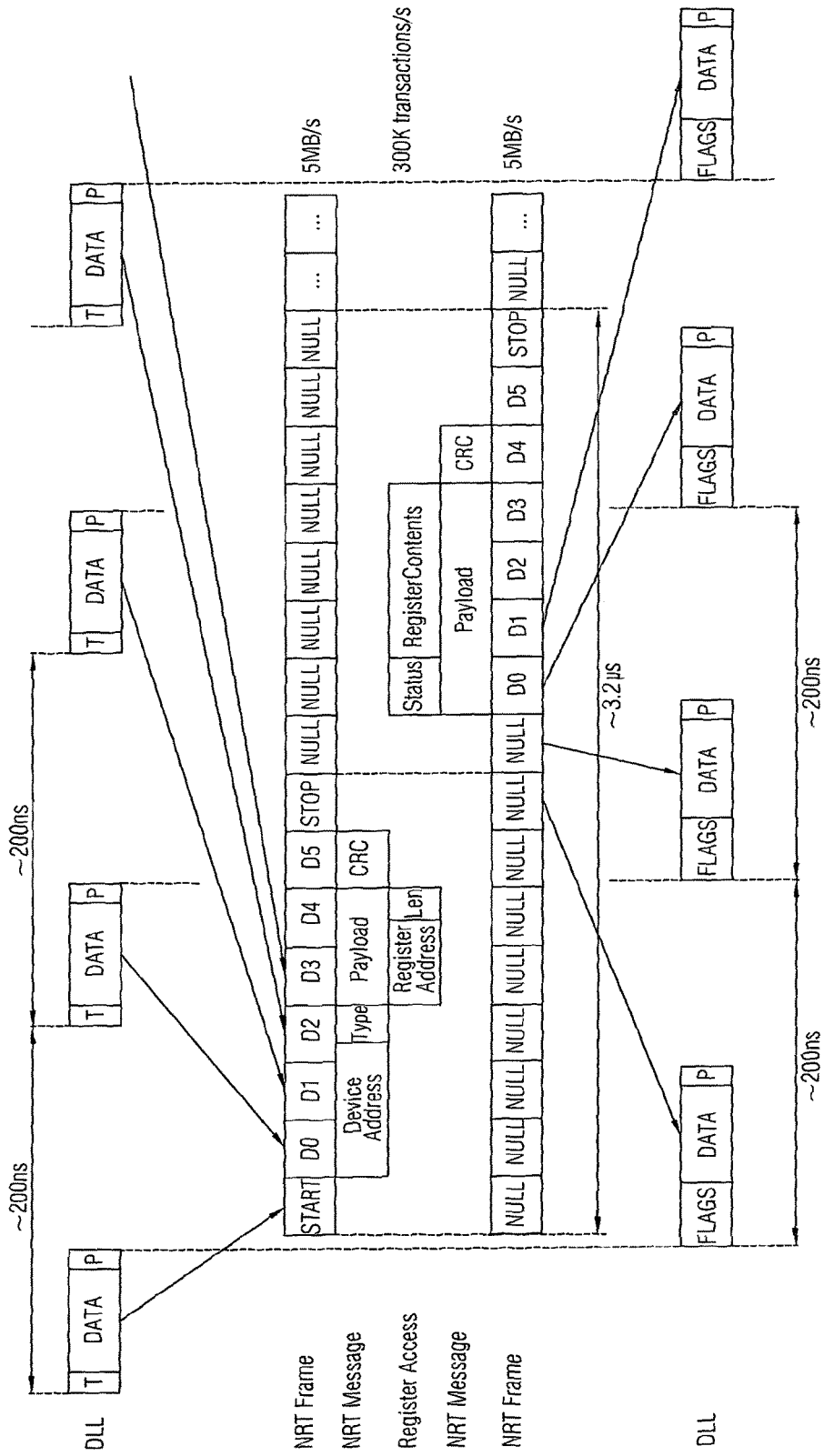

FIG. 6b illustrates an example procedure for writing data from the central controller into registers within (the address may be an individual device address or a device group address). As can be seen, an NRT message provides the device address and the payload of this message, the register address and register contents; and a further NRT message is used for acknowledgement of status data (valid or error). Similarly FIG. 6c illustrates a read request in which the central controller reads the contents of one or more registers within an individual addressed device. The payload of an NRT message carries the register address and the register contents are provided back in the payload of a further NRT message. The returned data may be, for example, configuration and/or measurement data.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A power semiconductor switching device control system for controlling a plurality of power semiconductor switching devices to switch in synchronisation, the system comprising:
    a coordinating control system; and
    a plurality of switching device controllers each coupled to said coordinating control system;
    wherein each said switching device controller is configured to control one or more respective said power semiconductor switching devices into a plurality of states including a fully-off state, a saturated-on state, and at least one intermediate state between said fully-off state and said saturated-on state;
    wherein said coordinating control system is configured to control said switching devices to switch in synchronism by controlling said switching device controllers; and
    wherein said coordinating control system is further configured to:
    control said switching device controllers to control said power semiconductor switching devices from an initial state comprising one of said fully-off state and said saturated-on state into said intermediate state;
    maintain said power semiconductor switching devices in said intermediate state to synchronize switching of said devices; and then
    control said switching device controllers to control said power semiconductor switching devices from said intermediate state into a final state comprising the other of said fully-off state and said saturated-on state.

2. A control system as claimed in claim 1 wherein each said switching device controller is configured to control said one or more respective said power semiconductor switching devices into a plurality of said intermediate states between said fully-off state and said saturated-on state; and wherein said coordinating control system is further configured to control said switching device controllers to control said power semiconductor switching device into each of said intermediate states when switching between said fully-off state and said saturated-on state, and to maintain said power semiconductor switching devices in each of said intermediate statues before transitioning to the next said intermediate state, to synchronize switching of said devices.

3. A control system as claimed in claim 1 wherein a or the said intermediate state comprises a ready-on state, wherein in said ready-on state a said power semiconductor switching device has a current intermediate between a fully-off current for a saturated-on current.

4. A control system as claimed in claim 1, wherein a or the said intermediate state comprises an active low voltage state, wherein in said active low voltage state a said power semiconductor switching device supports a voltage intermediate between a fully-off voltage and a saturated-on voltage.

5. A control system as claimed in claim 1, wherein said coordinating control system and each of said switching device controllers comprise a respective data communications interface for data communications between said coordinating control system and said switching device controllers; and
    wherein said coordinating control system is further configured to control said switching device controllers to control said power semiconductor switching devices by:
    issuing a control signal to said switching device controllers to control said power semiconductor switching devices from said initial state to said intermediate state;
    receiving a confirmation signal from said switching device controllers that said intermediate state has been achieved;
    waiting until each of said switching device controllers has confirmed that said intermediate state has been achieved; and then
    issuing a control signal to said switching device controllers to control said power semiconductor switching devices from said intermediate state to a subsequent said state.

6. A control system as claimed in claim 5 wherein said data communication interfaces comprise packet data communication interfaces.

7. A control system as claimed in claim 6 wherein said control signal and said confirmation signal comprises real time packet data communication signals.

8. A control system as claimed in claim 1 further comprising said power semiconductor switching devices, wherein said power semiconductor switching devices are connected to define a set of strings of series-connected devices, and wherein corresponding devices in each string of said set are connected in parallel.

9. A control system as claimed in claim 1 wherein said power semiconductor switching devices comprise IGBTs.

10. A coordinating control system for controlling a plurality of switching device controllers each coupled to the coordinating control system for switching a plurality of power semiconductor switching devices in synchronism, wherein each said switching device controller is configured to control one or more respective said power semiconductor switching devices into a plurality of states including a fully-off state, a saturated-on state, and at least one intermediate state between said fully-off state and said saturated-on state, the coordinating control system comprising:
    a system to control said power semiconductor switching devices to switch in synchronism by controlling said switching device controllers;
    wherein said system to control said power semiconductor switching devices is configured to:

control said switching device controllers to control said power semiconductor switching devices from an initial state comprising one of said fully-off state and said saturated-on state into said intermediate state;
maintain said power semiconductor switching devices in said intermediate state to synchronize switching of said devices; and then
control said switching device controllers to control said power semiconductor switching devices from said intermediate state into a final state comprising the other of said fully-off state and said saturated-on state.

* * * * *